(12) United States Patent
Morimoto et al.

(10) Patent No.: US 7,510,948 B2
(45) Date of Patent: Mar. 31, 2009

(54) METHOD FOR PRODUCING SOI WAFER

(75) Inventors: Nobuyuki Morimoto, Tokyo (JP); Hideki Nishihata, Tokyo (JP)

(73) Assignee: Sumco Corporation, Tokyo (JP)

( * ) Notice: Subject to any disclaimer, the term of this patent is extended or adjusted under 35 U.S.C. 154(b) by 33 days.

(21) Appl. No.: 10/570,354

(22) PCT Filed: Sep. 2, 2004

(86) PCT No.: PCT/JP2004/012728
§ 371 (c)(1),
(2), (4) Date: Mar. 3, 2006

(87) PCT Pub. No.: WO2005/024916
PCT Pub. Date: Mar. 17, 2005

(65) Prior Publication Data
US 2006/0266437 A1   Nov. 30, 2006

(30) Foreign Application Priority Data
Sep. 5, 2003   (JP) .............................. 2003-314758

(51) Int. Cl.
*H01L 21/301* (2006.01)
*H01L 21/30* (2006.01)
(52) U.S. Cl. ...................... 438/458; 439/455
(58) Field of Classification Search ............... 438/458
See application file for complete search history.

(56) References Cited

U.S. PATENT DOCUMENTS

| | | |
|---|---|---|
| 5,059,770 A | 10/1991 | Mahawili |
| 5,374,564 A | 12/1994 | Bruel |
| 6,211,041 B1 | 4/2001 | Ogura |
| 6,828,216 B2 | 12/2004 | Schwarzenbach et al. |
| 6,884,694 B2 * | 4/2005 | Park et al. ................ 438/455 |
| 7,052,978 B2 * | 5/2006 | Shaheen et al. .......... 438/463 |

(Continued)

FOREIGN PATENT DOCUMENTS

EP   0418541   3/1971

(Continued)

OTHER PUBLICATIONS

English language Abstract of JP 5-211128.

(Continued)

*Primary Examiner*—Matthew Smith
*Assistant Examiner*—Phillip Green
(74) *Attorney, Agent, or Firm*—Greenblum & Bernstein, P.L.C.

(57) ABSTRACT

Hydrogen gas is ion-implanted into a wafer for active layer via an oxide film. The wafer for active layer is bonded with a supporting wafer using the oxide film as the bonding surface. The bonded wafer is subjected to a heat treatment at the temperature in a range of 400° C. to 1000° C. As a result of this heat treatment, the bonded wafer is cleaved at the site of ion-implanted layer as the interface thereby producing an SOI wafer. In this heat treatment for cleavage, the temperature difference within the surface of the bonded wafer is controlled to be within 40° C. Consequently, the wafer can be cleaved and separated completely across its entire surface at the site of the ion-implanted layer as the interface without leaving any regions uncleaved.

5 Claims, 3 Drawing Sheets

U.S. PATENT DOCUMENTS

2003/0134489 A1* 7/2003 Schwarzenbach et al. ... 438/458
2003/0216008 A1 11/2003 Schwarzenbach et al.
2007/0026637 A1 2/2007 Endo et al.
2007/0032043 A1 2/2007 Endo et al.

FOREIGN PATENT DOCUMENTS

| EP | 1359615 | 11/2003 |
|---|---|---|
| JP | 5-211128 | 8/1993 |
| JP | 3048201 | 3/2000 |

OTHER PUBLICATIONS

U.S. Appl. No. 10/570,669 to Endo et al., which was filed on Mar. 6, 2006.

U.S. Appl. No. 10/570,668 to Endo et al., which was filed on Mar. 6, 2006.

* cited by examiner

METHOD FOR PRODUCING SOI WAFER

FIELD OF THE INVENTION

The present invention relates to a method for producing an SOI wafer, and more particularly to a method for producing an SOI wafer in combination with a cleavage method comprising a hydrogen ion-implantation.

DESCRIPTION OF THE PRIOR ART

An SOI wafer has been used in an LSI of high-speed low-power consumption, as it is considered superior to a conventional silicon wafer in some properties, including separation between devices, reduced parasitic capacity between a device and a substrate and a three-dimensional structure to be feasible.

One of methods for producing the SOI wafer in the prior art includes the smart cut method in which hydrogen ion is implanted into a silicon wafer surface and then the silicon wafer is bonded to another wafer, and subsequently thus obtained bonded wafer is subjected to a heat treatment for cleavage so as for a part of the silicon wafer to be cleaved and separated away at the site of ion-implanted layer serving as an interface layer. In this smart cut method, the wafer for an active layer that has been implanted with the hydrogen ion from the silicon wafer surface is bonded with the supporting wafer. Consequently, a bonded wafer having an insulating layer in the site of bonding interface is formed. After this step of process, thus bonded wafer is subjected to a heat treatment for cleavage. As for a set temperature used in the heat treatment for cleavage, as disclosed in Patent Document 1, for example, the heat treatment has to be carried out at approximately 500° C. or higher.

[Patent Document 1]
Japanese Patent No. 3048201

SUMMARY OF THE INVENTION

Problem to be Solved by the Invention

However, in this method, if a temperature distribution in a furnace, especially the temperature distribution within the surface of the bonded wafer, during the heat treatment for cleavage turns to be uneven, a re-arrangement of crystal and a void concentration within the surface are apt to be discontinuous. Further disadvantageously, there is a fear that it tends to deteriorate the uniformity of film thickness of an SOI layer, which would affect to subsequent steps for reducing the film thickness. There would be another problem that the above method produces a region in which the cleavage would not occur at the site of ion-implanted layer as the interface, inhibiting the SOI wafer from being produced.

An object of the present invention is to provide a method for producing an SOI wafer according to the smart cut method, in which the temperature within the surface of the bonded wafer is made substantially uniform during the heat treatment for cleavage.

Another object of the present invention is to provide a method for producing an SOI wafer allowing for a complete cleavage through the entire wafer at the site of the ion-implanted layer serving as the interface without leaving any uncleaved region.

Means to Solve the Problem

A first invention provides a method for producing an SOI wafer, comprising the steps of:

ion-implanting of a noble gas element to a wafer for active layer via an insulating film to form an ion-implanted layer in the active layer wafer;

subsequently bonding the active layer wafer with a supporting wafer via the insulating film disposed therebetween to form a bonded wafer; and then heat treating the bonded wafer while holding it at a set temperature so as to cleave and separate a part of the active layer wafer at a site of ion-implanted layer as an interface, wherein in the heat treatment, a temperature variation within a surface of the bonded wafer is controlled to be 40° C. or smaller so as to achieve the cleavage at the site of said ion-implanted layer as the interface.

In the method for producing the SOI wafer according to the first invention, firstly the ion-implanted layer is formed in the active layer wafer (e.g., a wafer comprising an oxide film formed on top of a silicon wafer). Subsequently, this active layer wafer is bonded with the supporting wafer (e.g., a silicon wafer) via the insulating film interposed therebetween. This bonding process of the active layer wafer with the supporting wafer consequently produces a bonded wafer with the intervention of the insulating film at the site of bonding surface. After this step of processing, the bonded wafer is heat treated at the set temperature (e.g., temperature in a range of 400° C. to 1000° C.). During this process, the temperature variation within the surface of the bonded wafer has been controlled within 40° C. Accordingly, bubbles of noble gas are formed in the ion-implanted layer, and the cleavage occurs at the site of ion-implanted layer as the interface. In this case, since the temperature within the surface of the bonded wafer has been held substantially uniform, it hardly produces any regions that will be left without occurrence of cleavage but a complete cleavage would be induced over the entire surface of the bonded wafer at the site of ion-implanted layer as the interface.

Thus, according to the first invention, in the method for producing the SOI wafer in accordance with the smart cut method, the temperature variation within the surface of the bonded wafer during the heat treatment for cleavage is controlled within 40° C. For example, assuming that the temperature at which the cleavage starts is 410° C. or higher, the cleavage takes effect in a region in the surface of the bonded wafer where the temperature is in a range of 410° C. to 450° C. However, the wafer is forced to be cleaved and separated at the site of bonding interface specifically in a region at the temperature of 400° C. Consequently, the SOI wafer partially lacking the SOI structure would be produced. It implies that the temperature variation within the surface of the bonded wafer immediately after the starting of the cleavage should be controlled to be within 40° C.

A diameter of the bonded wafer to be treated may be, for example, 200 mm or 300 mm.

Preferably, a heat treatment device used to provide the heat treatment for cleavage is an RTP (Rapid Thermal Processing) furnace of single wafer processing type. This is because the bonded wafer can be heated rapidly and uniformly by applying lamp heating to the wafers one by one in the single wafer processing type of furnace. On the other hand, it is difficult to control the temperature variation within the surface of the bonded wafer to be within 40° C. in a furnace of batch type where the heating rate of the bonded wafer varies depending on the introduction temperature and the introduction rate. If the batch type of furnace is used, the rate of temperature increase to the cleavage starting temperature should be controlled to be 20° C./min, for example, for carrying out the heat treatment for cleavage. With the rate of temperature increase over 20° C./min, there will be a local region within the wafer surface that is not able to follow the temperature increase. This may cause uneven temperature distribution across the wafer surface. Accordingly, if the rate of temperature increase is set to be 20° C./min or lower, the temperature variation over the entire surface of the bonded wafer can be controlled within 40° C. easily and accurately.

A second invention provides a method for producing an SOI wafer as defined in the first invention, in which the set temperature is in a range of 400° C. to 1000° C.

In the method for producing the SOI wafer according to the second embodiment, the set temperature for the heat treatment for cleavage of the bonded wafer has employed a range of 400° C. to 1000° C. The set temperature below 400° C. may be associated with a problem that the cleavage starting temperature of the bonded wafer would not be reached, failing in inducing the cleavage. With the temperature over 1000° C., such a problem may occur that a reaction tube (silica tube) of the heat treatment device could be deformed. There will be another problem arisen that the portions of the bonded wafer, which have been once separated, are brought into contact with each other at the site of interface and thus form a bond therein, where it will be difficult to make a cleavage later again. Specifically, it is required that the entire surface of the bonded wafer should be in a temperature range of 400° C. to 1000° C. and that the temperature variation within the surface should be 40° C. in maximum.

For the case employing the batch type of furnace, the temperature within the furnace during the introduction is required to be suppressed to 400° C. or lower, and if taking the throughput in production of the SOI wafer into account, preferably the temperature within the furnace during the introduction is in a range of 300° C. to 400° C. That is, the bonded wafer can be heated while keeping the small temperature variation within the surface of the bonded wafer by setting the introduction temperature at 400° C. or lower.

A third invention provides a method for producing an SOI wafer as defined in the second invention, in which the heat treatment is performed while holding the bonded wafer substantially vertical so as to induce the cleavage in the bonded wafer at the site of ion-implanted layer as the interface.

A heat source for heating the bonded wafer while holding the bonded wafer substantially vertical is disposed in proximal to the top and the back surfaces of the bonded wafer. The heat source may employ an infrared lamp, for example.

In the method for producing the SOI wafer according to the third invention, the bonded wafer is held vertical by a supporting jig made of silica disposed in a reaction chamber within the RTP furnace. Then, this bonded wafer is heat treated by the infrared lamp disposed laterally with respect to the top and the back surfaces of the bonded wafer.

The reason why the bonded wafer is held vertical is to prevent the cleaved and separated wafers after the heat treatment for cleavage from coming into contact with each other again. Then, the entire surface of this bonded wafer is heated uniformly and rapidly to thereby make the temperature within the surface of the bonded wafer substantially uniform. Thus, the complete cleavage can be achieved across the entire surface of the bonded wafer at the site of the ion-implanted layer as the interface.

Effect of the Invention

According to the present invention, in the method for producing the SOI wafer in accordance with the smart cut method, a bonded wafer is heat treated at a set temperature in a range of 400° C. to 1000° C. In this process, a temperature variation within the surface of the bonded wafer is controlled to be within 40° C. Consequently, bubbles of noble gas are formed in an ion-implanted layer, and the bonded wafer is cleaved and separated (i.e., a part of the active layer wafer is separated from the remaining part of the SOI wafer) at the site of the ion-implanted layer specifically in a region containing thus formed bubbles as the interface. Under this condition, the temperature within the surface of the bonded wafer has been substantially uniform. Owing to this, the complete cleavage can be achieved across the entire surface of the wafer at the site of the ion-implanted layer as the interface without producing any region that have been left not-cleaved.

DESCRIPTION OF REFERENCE NUMERALS

11 SOI wafer

DESCRIPTION OF THE PREFERRED EMBODIMENTS

A preferred embodiment of the present invention will now be described with reference to the attached drawings.

First Embodiment

One embodiment of the present invention will now be described with reference to FIGS. 1 to 3.

A method for producing an SOI wafer 11 in accordance with the smart cut method according to the present invention is carried out in the following manner.

Firstly, two pieces of silicon wafer are prepared, which have been made by slicing an ingot of monocrystal silicon grown in the CZ method and doped with boron. One of those prepared silicon wafers serves as an active layer wafer and the other of those silicon wafers serves as a supporting wafer. Then, an oxide film is formed on top of the silicon wafer prepared to be the active layer wafer. The formation of the silicon oxide film is achieved by introducing the silicon wafer into an oxidizing furnace and heating the silicon wafer at a predetermined temperature for a predetermined time. The silicon oxide film to be formed in this process may have a thickness of 150 nm.

Secondly, the silicon wafer with the oxide film formed thereon is set in a vacuum chamber of an ion-implanting device. Then, a predetermined dose of hydrogen ion is implanted into the active layer wafer from its surface through the oxide film. Consequently an ion-implanted layer is formed in the active layer wafer at the predetermined depth (extending across a predetermined range of depth within the silicon wafer).

Subsequently, the active layer wafer with the hydrogen ion implanted therein is bonded with the supporting wafer at the side of ion-implanted surface (i.e., oxide film surface) used as the bonding surface for the active layer wafer. Resultantly, a bonded wafer including an insulating film (i.e., the oxide film) intervening in the bonding surface is formed.

Those steps to be taken up to this stage of processing are analogous to the steps employed in a method for producing the SOI wafer in a typical smart cut method.

A device used for the heat treatment for cleavage of the bonded wafer 11 will now be described.

Figure 1:
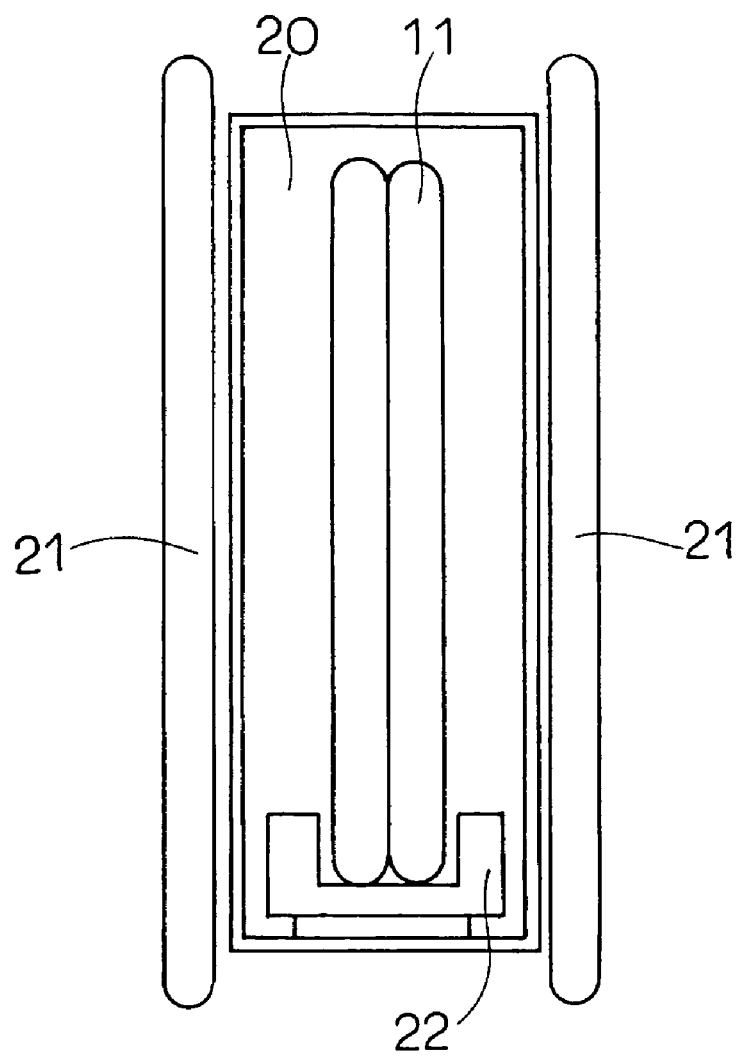
FIG. 1 is a front view showing a configuration of a device for providing a heat treatment for cleavage of a bonded wafer according to one embodiment of the present invention.
Figure 2:
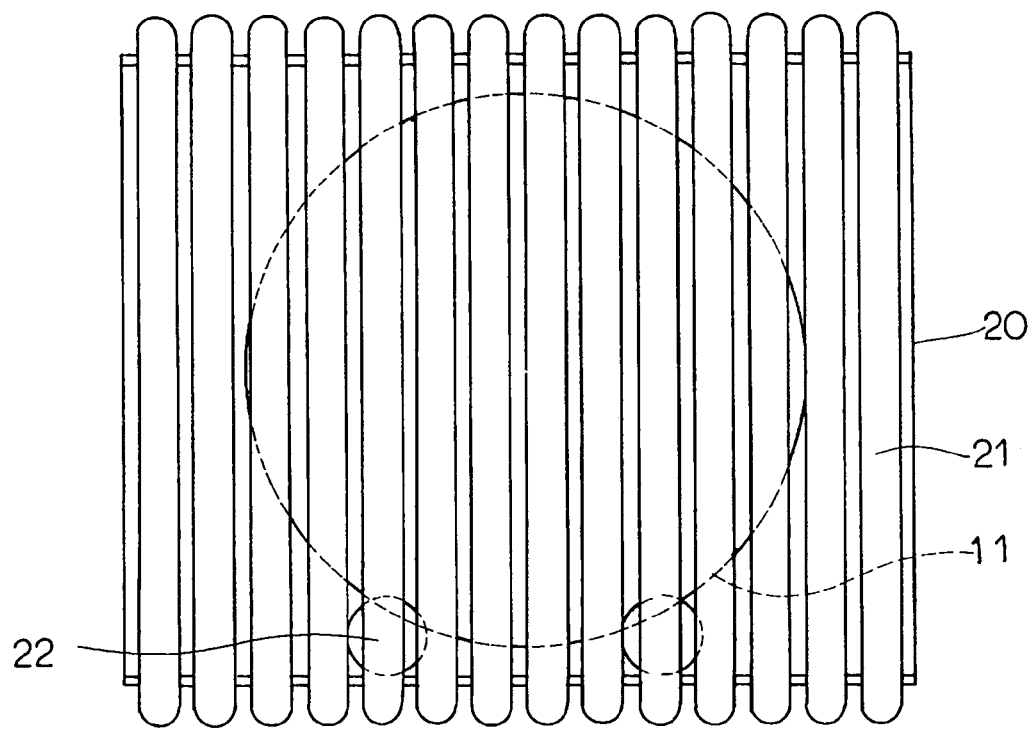
FIG. 2 is a side view showing a configuration of a device for providing a heat treatment for cleavage of a bonded wafer according to one embodiment of the present invention.
Figure 3:
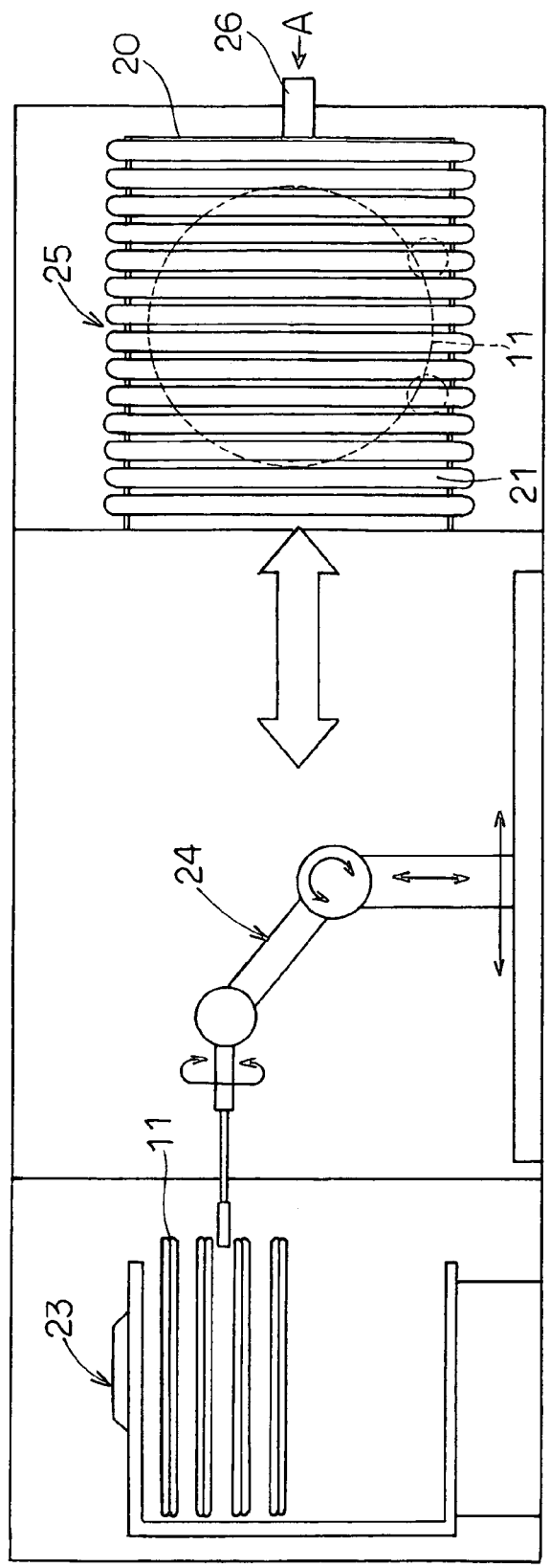
FIG. 3 is a side view showing a configuration of a transport device for transporting a bonded wafer to a device for providing a heat treatment for cleavage according to one embodiment of the present invention.

An RTP furnace 25 of single wafer processing type is employed as the device for providing the heat treatment for cleavage, as shown in FIGS. 1 to 3. This RTP furnace 25 can provide the control of the rate of temperature increase by as short as a unit of second in contrast with the batch type of furnace, so that it can heat the surface of the bonded wafer uniformly and rapidly.

A reaction chamber 20 is arranged in the RTP furnace 25. The reaction chamber 20 is provided with a supporting jig 22 made of silica for holding the bonded wafer 11 vertical. Further, a plurality of infrared lamps 21 serving as a heat source used for the heat treatment of the bonded wafer 11 is disposed laterally with respect to the top and the back surfaces of the bonded wafer 11 held vertically. The infrared lamp has an elongated configuration, and a plurality of those lamps is disposed vertically in the lateral sides with respect to the top and the back surfaces of the bonded wafer 11. This arrangement allows for the heat treatment for cleavage to be applied across the entire surface of the bonded wafer 11. Further, as shown in FIG. 3, a gas inlet port 26 is provided for introducing a gas into the reaction chamber 20.

Subsequently, a method of heat treatment for cleavage of the bonded wafer 11 will now be described.

The bonded wafer 11 comprising the active layer wafer with the ion-implanted layer formed therein is held horizontal in a wafer charier 23, as shown in FIG. 3. The bonded wafer 11 is taken out of the wafer carrier 23 by using a wafer transport robot 24. Further, the bonded wafer 11 taken out of the carrier 23 is held vertical and transported into the reaction chamber 20 of the RTP furnace 25. The bonded wafer 11 after having been transported into the reaction chamber 20 is supported vertical by the supporting jig 22 made of silica in the reaction chamber 20. In this step of process, the temperature during the introduction of the bonded wafer 11 into the reaction chamber 20 is a room temperature.

Then, the temperature within the reaction chamber 20 is increased from the room temperature to a set temperature defined by a range of 400° C. to 1000° C. (e.g., 500° C.) at a rate of temperature increase of 20° C./min, and the wafer 11 is held therein for 10 minutes. It is to be noted that if the rate of temperature increase exceeds 20° C./min, the temperature distribution across the wafer surface and thus a film thickness distribution across the SOI layer (i.e., the active layer) could be deteriorated. Therefore, preferably the rate of temperature increase should be 20° C./min or lower (see the result of below Table 3).

The reaction chamber 20 is full of $N_2$ gas atmosphere as the $N_2$ gas has been introduced through a gas inlet port 26 into the reaction chamber 20. Under this condition, the bubbles of hydrogen ion that has been implanted into the active layer wafer of the bonded wafer 11 are formed. Then, at the site of the ion-implanted layer containing thus formed bubbles as the interface, a part of the active layer wafer (a part of the bonded wafer 11) is cleaved and separated over its entire surface.

In this stage of process, the wafer 11 held vertical is heated uniformly and rapidly over its entire surface by the infrared lamps 21 disposed laterally with respect to the top and the back surfaces of the bonded wafer 11. This makes the temperature within the surface of the bonded wafer substantially uniform. This induces a complete cleavage and separation of the wafer at the site of the ion-implanted layer as the interface. Further, the bonded wafer 11 is heat treated for cleavage as it is held to be vertical. Therefore, this can prevent the portions of wafers after their having been cleaved and separated from being brought into contact with each other later again.

After the heat treatment for cleavage, a haze level in the cleaved surface (defined in the active layer wafer side) of the bonded wafer 11 was measured by using a surface detector (SFS6220). This was performed because the haze level tends to change in dependence on the thickness of the SOI layer and BOX layer (i.e., the buried oxide film) in the SOI wafer. The result from the measurement showed that the haze level equal to or higher than 2000 ppm was not confirmed in the cleaved surface of the bonded wafer 11, thus demonstrating that the cleavage process had been successfully performed to form the uniform cleavage over the entire surface.

The bonded wafer 11 after the cleavage is processed based on a typical method for producing an SOI wafer in accordance with the smart cut method so as to be finally produced as an SOI wafer. Specifically, the heat treatment is applied to the bonded wafer 11 in order to firmly bond the portion for the active layer wafer with the portion for the supporting wafer. As for the condition for this heat treatment, it should be performed at the temperature of 1100° C. or higher in the oxidizing gas atmosphere for approximately two hours.

Finally, the SOI layer surface is ground, and then thus ground surface is further mirror polished so as to reduce the film thickness of the SOI layer for finishing the SOI wafer.

Subsequently, for the heat treatment for cleavage of the bonded wafer 11, an experiment was conducted under different conditions as defined below. Specifically, (1) an experiment in order to determine the SOI layer distribution and the presence of any regions where the cleavage has not occurred by varying the temperature difference within the surface of the bonded wafer 11 during the heat treatment for cleavage (Table 1);

(2) an experiment in order to determine the SOI layer distribution and the presence of any regions where the cleavage has not occurred on the bonded wafer 11 that was introduced into a batch type of furnace under the condition of temperature in a range of 300° C. to 700° C., and after the temperature having increased to 700° C., held for 30 minutes, and then taken out of the furnace (Table 2); and (3) an experiment in order to determine the SOI layer distribution and the presence of any regions where the cleavage has not occurred on the bonded wafer 11 that was introduced into a batch type of furnace under the condition of temperature at 300° C., and subjected to the heat treatment for cleavage with different rates of temperature increase up to 500° C., and then taken out of the furnace (Table 3), were conducted, respectively.

It is to be noted that a surface inspection apparatus (SFS6220) was used for evaluation (of the SOI layer distribution) of the cleaved surface of the bonded wafer 11 in those experiments. Results are shown in Table 1 to Table 3.

TABLE 1

| | In-surface temperature difference | | | | |
|---|---|---|---|---|---|
| | 35° C. | 40° C. | 45° C. | 50° C. | 60° C. |
| SOI layer distribution | NIL | NIL | Present | Present | Present |
| Region of no cleavage occurred | NIL | NIL | NIL | NIL | Present |

TABLE 2

| | Introduction temperature | | | | |
|---|---|---|---|---|---|
| | 300° C. | 400° C. | 500° C. | 600° C. | 700° C. |
| SOI layer distribution | NIL | NIL | Present | Present | Present |
| Region of no cleavage occurred | NIL | NIL | NIL | NIL | Present |

TABLE 3

| | Rate of temperature increase | | | | |
|---|---|---|---|---|---|
| | 5° C./min | 10° C./min | 20° C./min | 25° C./min | 30° C./min |
| SOI layer distribution | NIL | NIL | NIL | Present | Present |
| Region of no cleavage occurred | NIL | NIL | NIL | NIL | Present |

It has been confirmed from the above experiment results that if the temperature difference within the surface of the bonded wafer 11 is controlled to be within 40° C., then the bonded wafer 11 can be cleaved and separated completely across the entire surface. It has been further confirmed that if the heat treatment for cleavage is carried out with the set temperature in a range of 400° C. to 1000° C., when employing the batch type of furnace, then the bonded wafer 11 can be cleaved and separated completely across the entire surface without leaving any uncleaved regions. It has been also confirmed that if the heat treatment for cleavage is carried out with the rate of temperature increase set to 20° C./min or lower, when employing the batch type of furnace, then the bonded wafer 11 can be cleaved and separated completely across the entire surface without leaving any uncleaved regions.

What is claimed is:

1. A method for producing an SOI wafer, comprising
   ion-implanting a noble gas element in an active layer wafer via an insulating film to form an ion-implanted layer in the active layer wafer;
   subsequently bonding the active layer wafer with a supporting wafer via the insulating film disposed therebetween to form a bonded wafer; and then
   performing heat treatment on the bonded wafer while holding the bonded wafer at a set temperature so as to cleave and separate a part of the active layer wafer at a site of the ion-implanted layer as an interface, and
   controlling the heat treatment so that temperature variation within a surface of the bonded wafer is 40° C. or less so as to achieve the cleavage at the site of the ion-implanted layer as the interface by positioning a plurality of heat sources, laterally with respect to a top surface and a back surface of the bonded wafer, so that the heat sources uniformly heat the surface of the bonded wafer.

2. A method for producing an SOI wafer in accordance with claim 1, in which the set temperature is in a range of 400° C. to 1000° C.

3. A method for producing an SOI wafer in accordance with claim 2, in which the heat treatment is performed while holding the bonded wafer substantially vertical so as to induce the cleavage in the bonded wafer at the site of the ion-implanted layer as the interface.

4. A method for producing an SOI wafer in accordance with claim 1, in which the heat treatment is performed while holding the bonded wafer substantially vertical so as to induce the cleavage in the bonded wafer at the site of the ion-implanted layer as the interface.

5. A method according to claim 1, wherein the plurality of heat sources are a plurality of infrared lamps.

* * * * *